United States Patent
Lin et al.

(10) Patent No.: US 8,946,716 B2
(45) Date of Patent: Feb. 3, 2015

(54) CAPACITOR STRUCTURE OF GATE DRIVER IN PANEL

(71) Applicant: Chunghwa Picture Tubes, Ltd., Taoyuan (TW)

(72) Inventors: Shih-Chieh Lin, Taipei (TW); Wen-Chuan Wang, New Taipei (TW); Wei-Lien Sung, Taitung County (TW); Bo-Han Chu, New Taipei (TW)

(73) Assignee: Chunghwa Picture Tubes, Ltd., Taoyuan County (TW)

( * ) Notice: Subject to any disclaimer, the term of this patent is extended or adjusted under 35 U.S.C. 154(b) by 0 days.

(21) Appl. No.: 13/953,743

(22) Filed: Jul. 30, 2013

(65) Prior Publication Data
US 2014/0291803 A1 Oct. 2, 2014

(30) Foreign Application Priority Data
Mar. 26, 2013 (TW) .............................. 102205545 U

(51) Int. Cl.
*H01L 29/04* (2006.01)
*H01L 31/036* (2006.01)
*H01L 31/0376* (2006.01)
*H01L 31/20* (2006.01)
*H01L 49/02* (2006.01)

(52) U.S. Cl.
CPC ..................................... *H01L 28/60* (2013.01)
USPC .. 257/59; 257/72; 257/E29.117; 257/E29.273

(58) Field of Classification Search
USPC .............. 257/59, 72, 258, E29.117, E29.273
See application file for complete search history.

(56) References Cited

U.S. PATENT DOCUMENTS

| 8,164,094 B2 | 4/2012 | Liou et al. |
| 2007/0007557 A1* | 1/2007 | Kwak et al. .................. 257/239 |
| 2011/0007049 A1 | 1/2011 | Kikuchi et al. |
| 2011/0012880 A1 | 1/2011 | Tanaka et al. |

FOREIGN PATENT DOCUMENTS

TW I310101 5/2009

* cited by examiner

*Primary Examiner* — Hoai V Pham
(74) *Attorney, Agent, or Firm* — CKC & Partners Co., Ltd.

(57) ABSTRACT

A capacitor structure of gate driver in panel (GIP) includes a first metal layer, a first dielectric layer, a second metal layer, a second dielectric layer, a first and second transparent capacitor electrode layers. The first dielectric layer covers the first metal layer. The second metal layer is disposed on the first dielectric layer and coupled to the first metal layer. The second dielectric layer covers the second metal layer. The first transparent capacitor electrode layer is disposed on the first dielectric layer and connected to the second metal layer. The second transparent capacitor electrode layer is disposed on the second dielectric layer and coupled to the first metal layer, in which the second and first transparent capacitor electrode layers are arranged to be stacked in a thickness direction and mutually opposed across the second dielectric layer therebetween.

4 Claims, 14 Drawing Sheets

CAPACITOR STRUCTURE OF GATE DRIVER IN PANEL

RELATED APPLICATIONS

This application claims priority to Taiwanese Application Serial Number 102205545, filed Mar. 26, 2013, which is herein incorporated by reference.

BACKGROUND

1. Technical Field

The present invention relates to a capacitor structure of gate driver in panel (GIP).

2. Description of Related Art

In order to reduce a cost of a display panel, a scan driving circuit has been directly formed on the panel, and thus there is no need for buying additional gate driving integrated circuits (ICs). The panel without any gate driving IC is called as a gate driver in panel (GIP) type panel. However, as to a high-resolution display panel, the scan driving circuit should have high capacitance. As such, the capacitor structure may occupy a large area of the overall scan driving circuit, so as to increase a width of a border, which is disadvantageous to meet a need for narrowing a border. Also, a general capacitor electrode is made of a metal and opaque, such that cannot be applied in a one-drop filling (ODF) process.

Therefore, there is a need for an improved capacitor structure to shorten the width of the border and able to be applied in the ODF process so as to significantly reduce the process time and the cost.

SUMMARY

An objective of the present invention is to provide an improved capacitor structure having a plurality of transparent capacitor electrode layers and occupying a small area of an overall scan driving circuit to meet a need for narrowing a border. Further, the capacitor structure has an enough light transmittance and is able to be applied in a one-drop filling (ODF) process, such that the process time and the cost can be reduced.

One aspect of the present invention provides a capacitor structure of gate driver in panel including a first metal layer, a first dielectric layer, a second metal layer, a second dielectric layer, a first transparent capacitor electrode layer and a second transparent capacitor electrode layer. The first dielectric layer covers the first metal layer and includes a first opening exposing a portion of the first metal layer. The second metal layer is disposed on the first dielectric layer, and a portion of the second metal layer is coupled to the first metal layer through the first opening. The second dielectric layer covers the) second metal layer and includes a second opening disposed right above the first opening exposing the portion of the second metal layer. The first transparent capacitor electrode layer is disposed on the first dielectric layer and connected to another portion of the second metal layer. The second transparent capacitor electrode layer is disposed on the second dielectric layer and coupled to the first metal layer through the second opening, wherein the second transparent capacitor electrode layer and the first transparent capacitor electrode layer are arranged to be stacked in a thickness direction and mutually opposed across the second dielectric layer therebetween.

According to one embodiment of the present invention, the capacitor structure further comprises a third transparent capacitor electrode layer connected to the first metal layer, wherein the third transparent capacitor electrode layer and the first transparent capacitor electrode layer are arranged to be stacked in the thickness direction and mutually opposed across the first dielectric layer therebetween.

According to one embodiment of the present invention, the second metal layer is disposed on or under the first transparent capacitor electrode layer.

According to one embodiment of the present invention, the first metal layer is disposed on or under the third transparent capacitor electrode layer.

According to one embodiment of the present invention, the first metal layer and the second metal layer have openwork patterns, and one of the openwork patterns includes a frame-shaped pattern or a grid-like pattern.

According to one embodiment of the present invention, the panel comprises a thin film transistor (TFT), and the first metal layer and a gate electrode of the TFT are formed simultaneously, and the second metal layer and a source electrode of the TFT are formed simultaneously, and the second transparent capacitor electrode layer and a common transparent electrode of the TFT are formed simultaneously, and the first transparent capacitor electrode layer and a pixel electrode of the TFT are formed simultaneously.

Another aspect of the present invention provides a capacitor structure of gate driver in panel including a first metal layer, a first dielectric layer, a second metal layer, a second dielectric layer, a third metal layer, a third dielectric layer, a first transparent capacitor electrode layer and a second transparent capacitor electrode layer. The first dielectric layer covers the first metal layer and includes a first opening exposing a portion of the first metal layer. The second metal layer is disposed on the first dielectric layer, and a portion of the second metal layer is coupled to the first metal layer through the first opening. The second dielectric layer covers the second metal layer and includes a second opening and a third opening, the second opening being disposed right above the first opening exposing the portion of the second metal layer, the third opening exposing another portion of the second metal layer. The third metal layer is disposed on the second dielectric layer. The third dielectric layer covers the third metal layer and includes a fourth opening, a fifth opening and a sixth opening, the fourth opening being disposed right above the second opening, the fifth opening being disposed right above the third opening, the sixth opening being disposed right above the third metal layer. The first transparent capacitor electrode layer is disposed on the second dielectric layer and connected to the third metal layer. The second transparent capacitor electrode layer is disposed on the third dielectric layer and coupled to the first metal layer, the second metal layer and the third metal layer respectively through the fourth opening, the fifth opening and the sixth opening, wherein the second transparent capacitor electrode layer and the first transparent capacitor electrode layer are arranged to be stacked in a thickness direction and mutually opposed across the third dielectric layer therebetween.

According to one embodiment of the present invention, the capacitor structure further comprises a third transparent capacitor electrode layer connected to the first metal layer, wherein the third transparent capacitor electrode layer and the first transparent capacitor electrode layer are arranged to be stacked in the thickness direction and mutually opposed across the first dielectric layer and the second dielectric layer therebetween.

According to one embodiment of the present invention, the capacitor structure further comprises a fourth transparent capacitor electrode layer connected to the second metal layer, wherein the fourth transparent capacitor electrode layer and the first transparent capacitor electrode layer are arranged to be stacked in the thickness direction and mutually opposed across the second dielectric layer therebetween.

According to one embodiment of the present invention, the third metal layer is disposed on or under the first transparent capacitor electrode layer.

According to one embodiment of the present invention, the first metal layer is disposed on or under the third transparent capacitor electrode layer.

According to one embodiment of the present invention, the second metal layer is disposed on or under the fourth transparent capacitor electrode layer.

According to one embodiment of the present invention, the third metal layer has an openwork pattern, and the openwork pattern includes a frame-shaped pattern or a grid-like pattern.

According to one embodiment of the present invention, the panel comprises a TFT, and the first metal layer and a gate electrode of the TFT are formed simultaneously, and the second metal layer and a source electrode of the TFT are formed simultaneously, and the second transparent capacitor electrode layer and a pixel electrode of the TFT are formed simultaneously.

According to one embodiment of the present invention, the panel further comprises a common line, and the third metal layer and the common line are formed simultaneously.

According to one embodiment of the present invention, the panel further comprises a common transparent electrode, and the first transparent capacitor electrode layer and the common transparent electrode are formed simultaneously.

In the embodiments of the present invention, the transparent capacitor electrode layers arranged to be stacked in the thickness direction may be regarded as a parallel capacitor, which can increase the capacitance and reduce the occupying area of the overall scan driving circuit, such that it can meet the need for narrowing the border. Further, since the light-penetrable capacitor structure has a light transmittance that can meet a need for a photo-curable resin used in the ODF process, it can be applied in the ODF process. Compared to a conventional liquid crystal injection process, the ODF process is able to save the process time and the cost.

BRIEF DESCRIPTION OF THE DRAWINGS

The invention may be more fully understood by reading the following detailed description of the embodiment, with reference made to the accompanying drawings as follows.

DETAILED DESCRIPTION

Figure 1:
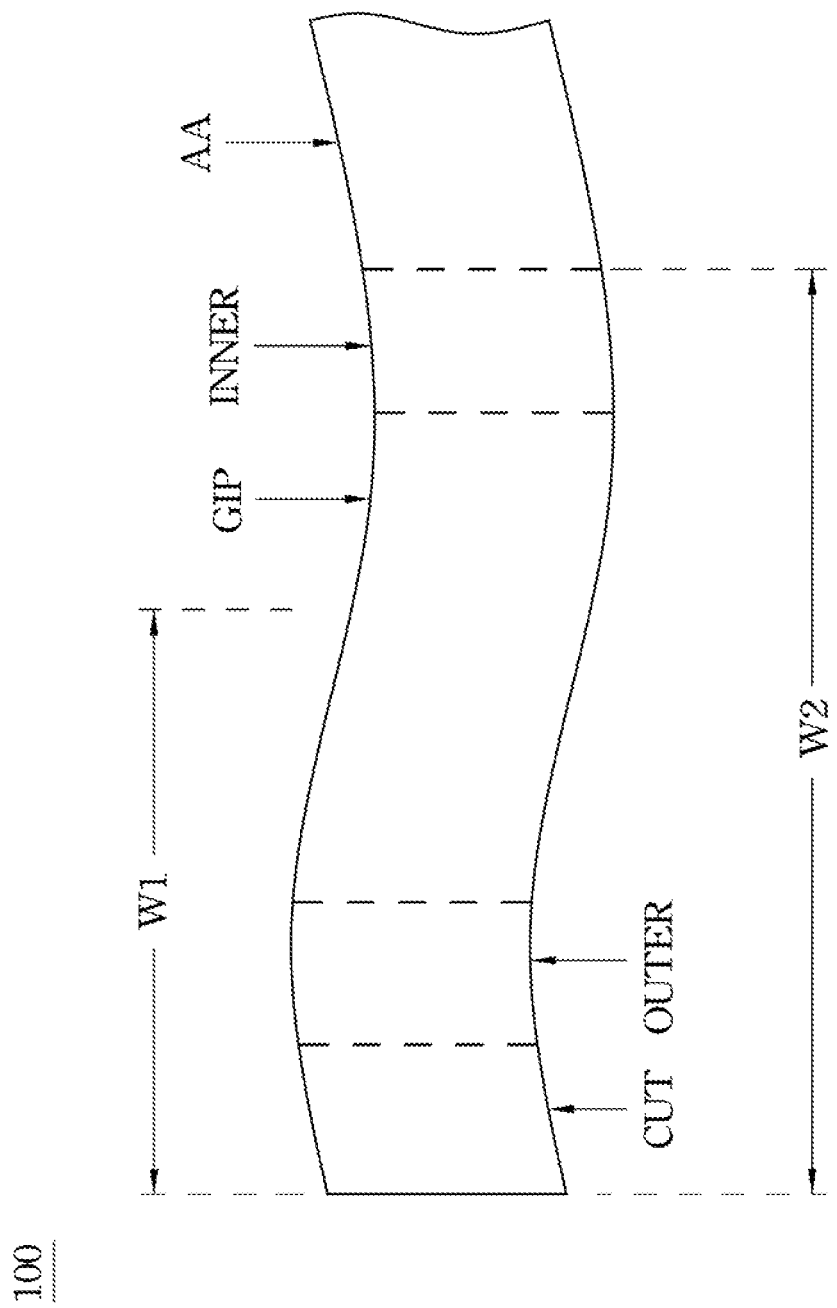
FIG. 1 is a top view of a portion of a driving substrate according to one embodiment of the present invention.

FIG. 1 is a top view of a portion of a driving substrate 100 according to one embodiment of the present invention. The driving substrate 100 includes an active area AA, an inner circuit area INNER, a scan driving circuit area GIP, an outer circuit area OUTER and an cutting area CUT. A border includes the inner circuit area INNER, the scan driving circuit area GIP, the outer circuit area OUTER and the cutting area CUT; that is, a width of the border is W2. A thin film transistor (TFT) or a TFT array may be disposed in the active area AA. Circuits disposed in the inner circuit area INNER and the outer circuit area OUTER may be electrically connected to circuits disposed in the active area AA. A gate driving circuit may be disposed in the scan driving circuit area GIP. A cutting line is disposed in the cutting area CUT. Of course, the areas may be appropriately changed according to practical applications, and not limited to those shown in FIG. 1.

The driving substrate 100 of the embodiment of the present invention may be applied in a one-drop filling (ODF) process, and the process steps are briefly described below. First, a frame sealant is coated around edges of the driving substrate 100, and a width of the frame sealant covering the driving substrate 100 is W1. Next, liquid crystal is dropped on the driving substrate 100, and the driving substrate 100 and an opposite substrate (not shown) are then assembled and the frame sealant is cured. The frame sealant is usually a photo-curable resin, such that the position that the frame sealant is covered on should have an enough light transmittance. Therefore, in the embodiments, a light-penetrable capacitor structure is disposed on the scan driving circuit area GIP to have enough light transmittance to be applied in the ODF process. Also, a plurality of transparent capacitor electrode layers of the light-penetrable capacitor structure arranged to be stacked in a thickness direction may be regarded as a parallel capacitor, which can increase capacitance and reduce occupying area of the overall scan driving circuit, such that the width W2 of the border can be shortened. The embodiments of the light-penetrable capacitor structure will be described below in detail.

Figure 2:
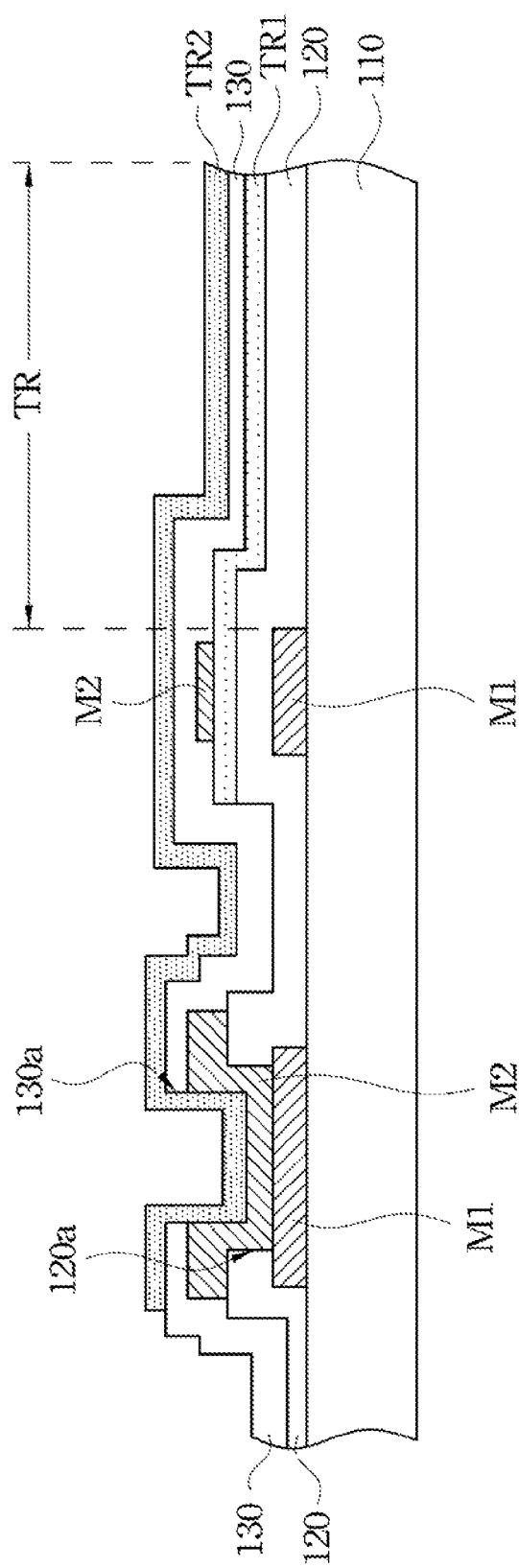
FIG. 2 is a cross-sectional view of a capacitor structure according to Embodiment 1 of the present invention.

FIG. 2 is a cross-sectional view of a capacitor structure of gate driver in panel (GIP) according to Embodiment 1 of the present invention. In this specification, "gate driver in panel" refers to a scan driving circuit structure directly formed on a substrate of the driving substrate (e.g., a TFT substrate). As shown in FIG. 2, a first metal layer M1, a first dielectric layer 120, a first transparent capacitor electrode layer TR1, a second metal layer M2, a second dielectric layer 130 and a second transparent capacitor electrode layer TR2 are sequentially stacked on a substrate 110 and constitute a capacitor structure of the scan driving circuit structure.

The first metal layer M1 is disposed on the substrate 110. The first dielectric layer 130 covers the first metal layer M1 and includes a first opening 120a exposing a portion of the first metal layer M1.

The second metal layer M2 is disposed on the first dielectric layer 120, and a portion of the second metal layer M2 is coupled to the first metal layer M1 through the first opening 120a.

The second dielectric layer 130 covers the second metal layer M2 and includes a second opening 130a disposed right above the first opening 120a exposing the portion of the second metal layer M2.

The first transparent capacitor electrode layer TR1 is disposed on the first dielectric layer 120 and connected to another portion of the second metal layer M2.

The second transparent capacitor electrode layer TR2 is disposed on the second dielectric layer 130 and coupled to the first metal layer M1 through the second opening 130a, in which the second transparent capacitor electrode layer TR2 and the first transparent capacitor electrode layer TR1 are arranged to be stacked in the thickness direction and mutually opposed across the second dielectric layer 130 therebetween. As such, the first transparent capacitor electrode layer TR1, the second dielectric layer 130 and the second transparent capacitor electrode layer TR2 constitute a capacitor.

The first transparent capacitor electrode layer TR1 directly receives a voltage from the other portion of the second metal layer M2. The second transparent capacitor electrode layer TR2 is coupled to the first metal layer M1 through the portion of the second metal layer M2 to receive a voltage from the first metal layer M1. The stacked structure of the conductive layers in the first opening 120a and the second opening 130a may be the second metal layer M2, the first transparent capacitor electrode layer TR1 or a combination thereof but not limited thereto, as long as the second transparent capacitor electrode layer TR2 is able to electrically connected to the first metal layer M1.

Figure 3:
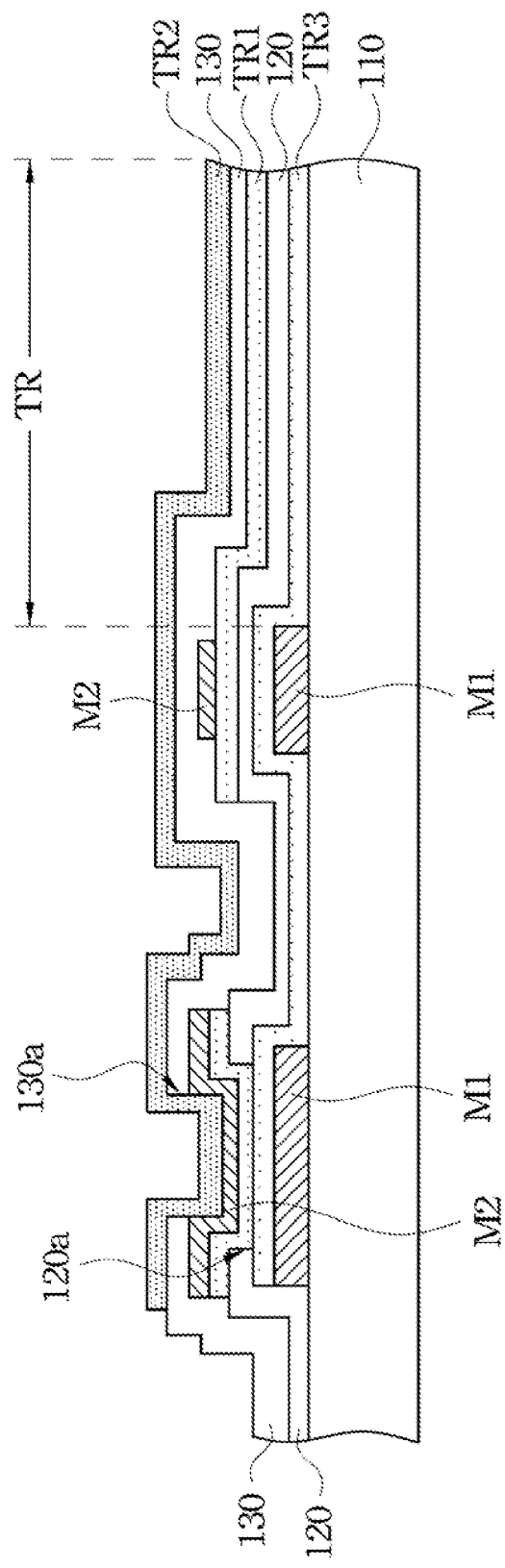
FIG. 3 is a cross-sectional view of a capacitor structure according to Embodiment 2 of the present invention.

FIG. 3 is a cross-sectional view of a capacitor structure including three transparent capacitor electrode layers according to Embodiment 2 of the present invention. The difference between the capacitor structure of FIG. 3 and that of FIG. 2 is that the capacitor structure of FIG. 3 further includes a third transparent capacitor electrode layer TR3. The third transparent capacitor electrode layer TR3 and the first transparent capacitor electrode layer TR1 are arranged to be stacked in the thickness direction and mutually opposed across the first dielectric layer 120 therebetween. Also, the third transparent capacitor electrode layer TR3 is connected to the first metal layer M1 to receive a voltage therefrom. As such, the third transparent capacitor electrode layer TR3, the first dielectric layer 120, the first transparent capacitor electrode layer TR1, the second dielectric layer 130 and the second transparent capacitor electrode layer TR2 may constitute a capacitor. The second transparent capacitor electrode layer TR2 shown in FIG. 2 is electrically connected to the first metal layer M1 through the second metal layer M2, such that a contact resistance between the second transparent capacitor electrode layer TR2 and the first metal layer M1 is low; on the other hand, the second transparent capacitor electrode layer TR2 shown in FIG. 3 is electrically connected to the first metal layer M1 through the second metal layer M2, the first transparent capacitor electrode layer TR1 and the third transparent capacitor electrode layer TR3, such that a contact resistance between the second transparent capacitor electrode layer TR2 and the first metal layer M1 is high.

Figure 4:
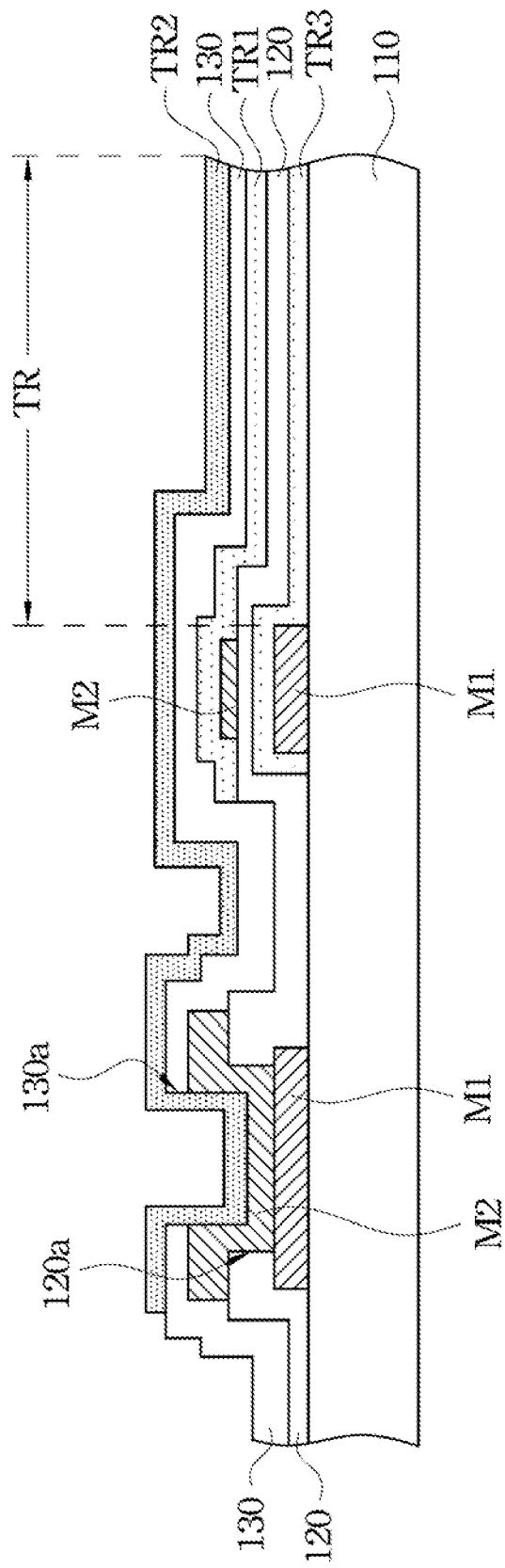
FIG. 4 is a cross-sectional view of a capacitor structure according to Embodiment 3 of the present invention.

FIG. 4 is a cross-sectional view of a capacitor structure including three transparent capacitor electrode layers according to Embodiment 3 of the present invention. The difference between the capacitor structure of FIG. 4 and that of FIG. 2 is that the second metal layer M2 of FIG. 4 is disposed under the first transparent capacitor electrode layer TR1.

Figure 5:
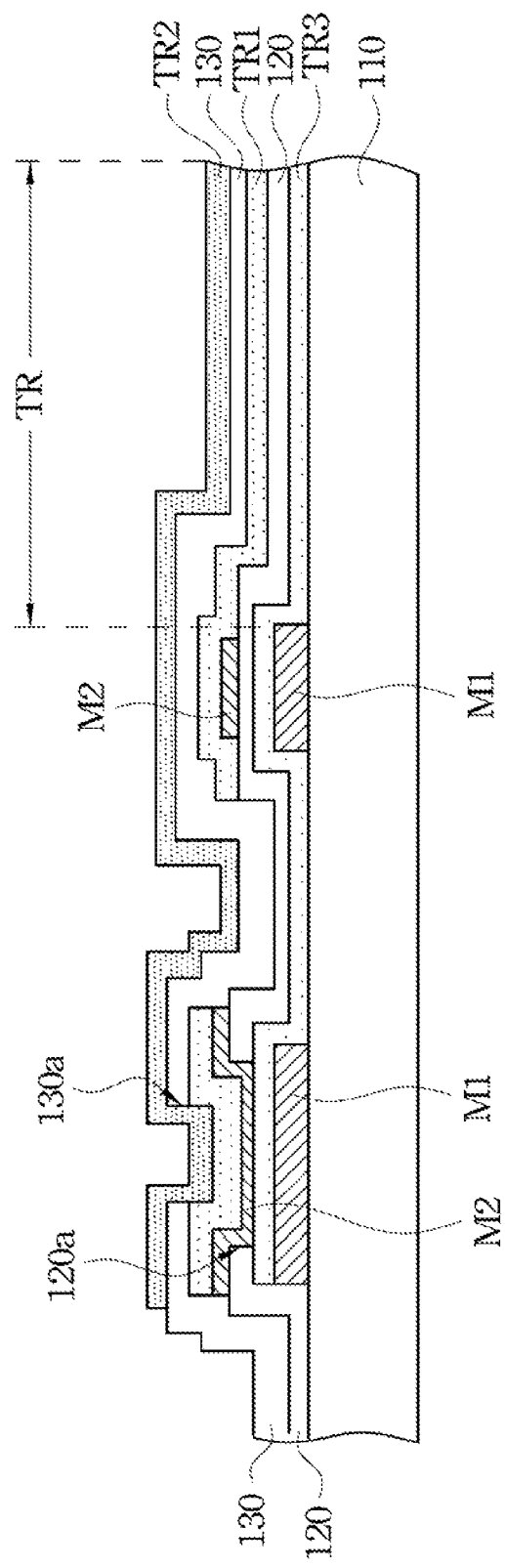
FIG. 5 is a cross-sectional view of a capacitor structure according to Embodiment 4 of the present invention.

FIG. 5 is a cross-sectional view of a capacitor structure including three transparent capacitor electrode layers according to Embodiment 4 of the present invention. The difference between the capacitor structure of FIG. 5 and that of FIG. 3 is that the second metal layer M2 of FIG. 5 is disposed under the first transparent capacitor electrode layer TR1.

Figure 6A:
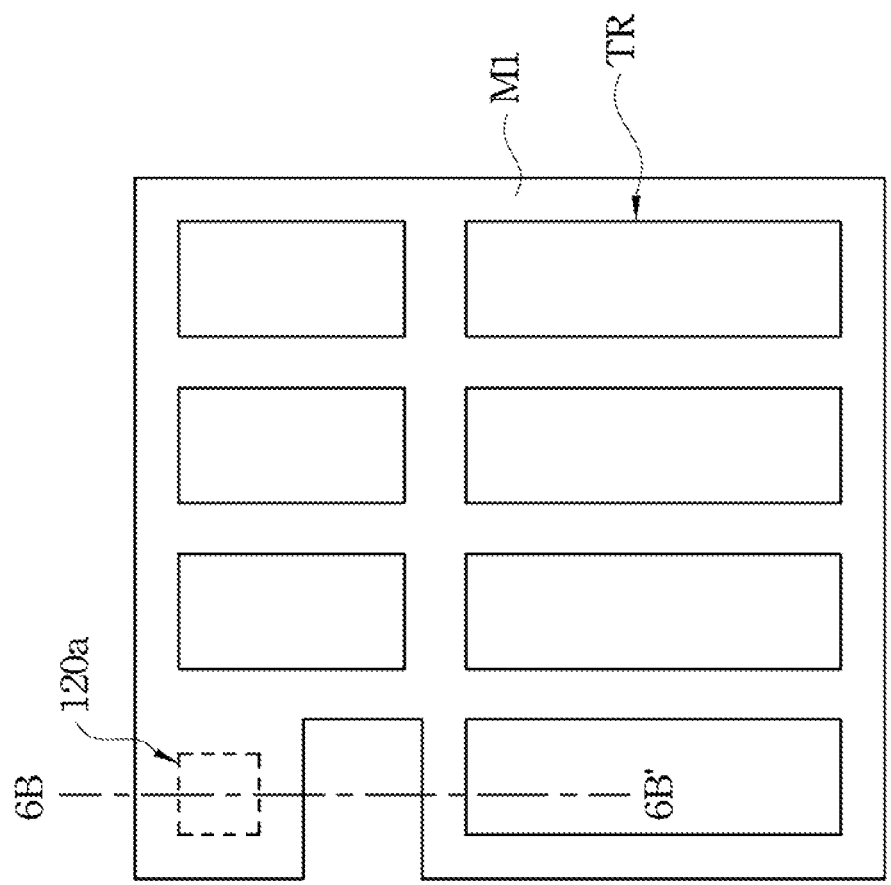
FIGS. 6A-6B are respectively a top view and a cross-sectional view of a capacitor structure according to Embodiment 5 of the present invention.
Figure 6B:
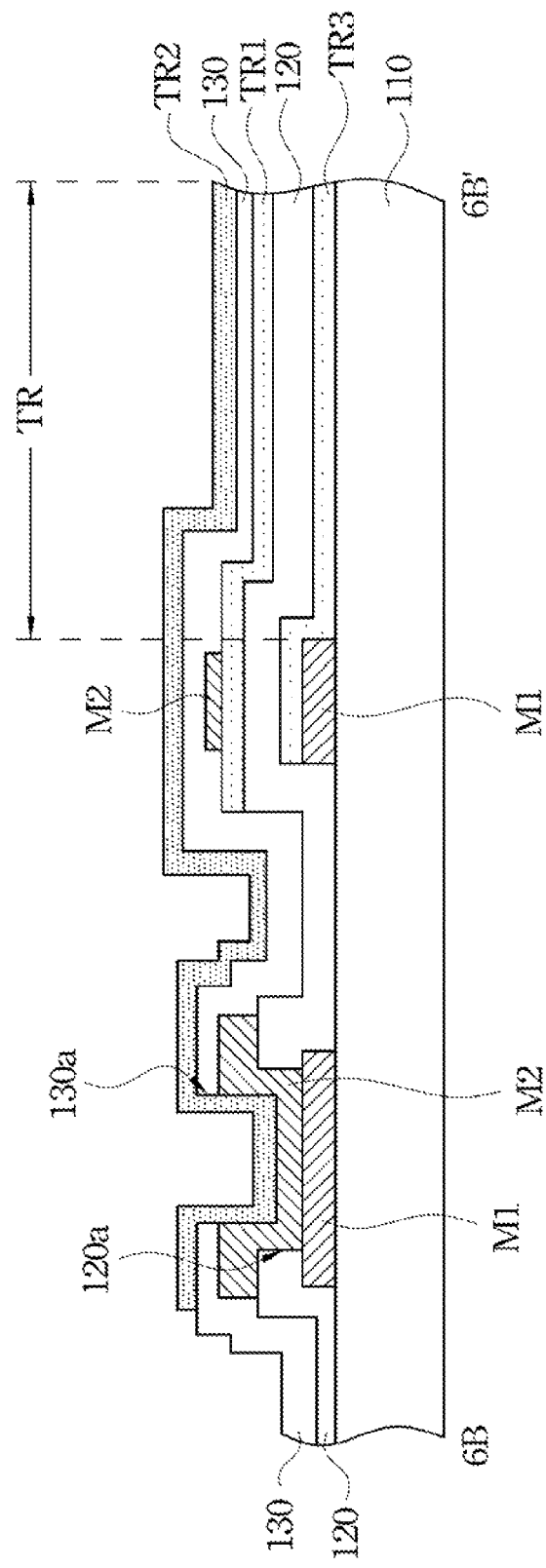

FIGS. 6A-6B are respectively a top view and a cross-sectional view of a capacitor structure according to Embodiment 5 of the present invention. In the embodiment, the first metal layer M1 and the second metal layer M2 may have openwork patterns, such as a frame-shaped pattern or a grid-like pattern. The pattern of the second metal layer M2 may be substantially overlapped with that of the first metal layer M1 shown in FIG. 6A. In the specification, "frame-shaped pattern" refers to a patterned metal layer having an opening to let light pass through. "Grid-like pattern" refers to a patterned metal layer having a plurality of openings to let light pass through. That is, a window area of the openwork pattern can be regarded as a light-transmission area TR. The openwork pattern made of a metal can be used to reduce electrical resistance and maintain an enough light transmittance since a surface resistance of the metal is lower than that of the transparent capacitor electrode layer. Of course, in practical applications, the shape of the openwork pattern can be changed according to the need of the light transmittance, and not limited to the embodiment shown in FIG. 6A.

When each element of the TFT is formed on the substrate 110, each of the metal layers, the dielectric layers and the transparent capacitor electrode layers of the capacitor structure of the embodiments of the present invention can be formed simultaneously. The capacitor structure can be combined with technology of in plane switching (IPS) or fringed field switching (FFS), but not limited thereto. For instance, the capacitor structure also can be combined with technology of twisted nematic (TN) or vertical alignment (VA).

Figure 7:
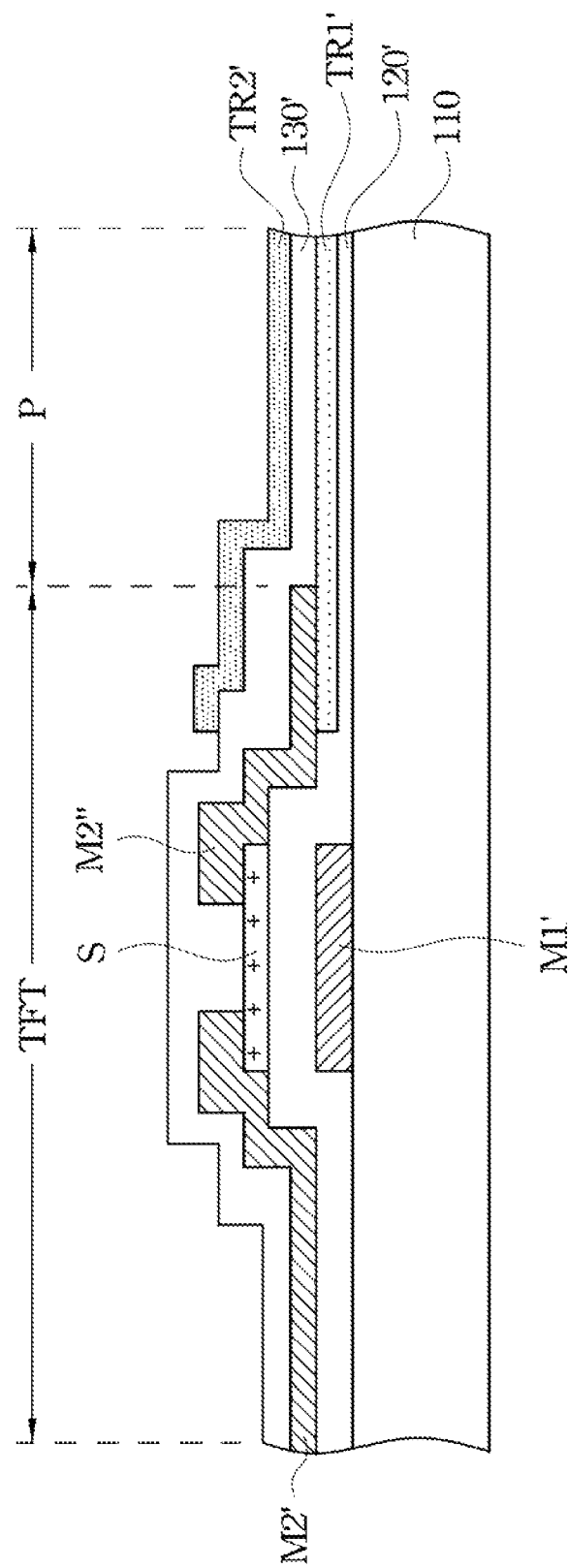
FIG. 7 is a cross-sectional view of both a thin film transistor (TFT) region and a sub-pixel region of a driving substrate according to one embodiment of the present invention.

With a bottom gate type TFT and the capacitor structure of FIG. 2, the specific embodiments of each layer are described below. FIG. 7 is a cross-sectional view of both a TFT region TFT and a sub-pixel region P of a driving substrate according to one embodiment of the present invention. The TFT region TFT and the sub-pixel region P may be disposed in the active area AA of FIG. 1. The driving substrate includes a TFT including a gate electrode M1', a gate dielectric layer 120', a semiconductor layer S, a source electrode M2' and a drain electrode M2", a first protective layer 130', a pixel electrode TR1 and a common transparent electrode TR2'.

Please refer to FIG. 2 and FIG. 7, the first metal layer M1 and the gate electrode M1' of the TFT may be formed in a same process. That is, the first metal layer M1 may be made of a material of the gate electrode M1' of the TFT. The gate electrode M1' may be made of a metal or a metal compound. The metal includes molybdenum (Mo), chromium (Cr), aluminum (Al), neodymium (Nd), titanium (Ti), copper (Cu), silver (Ag), gold (Au), zinc (Zn), indium (In), gallium (Ga), other suitable materials or a combination thereof. The metal compound includes metal alloys, metal oxides, metal nitrides, metal oxynitrides, other suitable materials or a combination thereof.

The first dielectric layer 120 and the gate dielectric layer 120' may be formed in a same process. The gate dielectric layer 120' may be made of a material including organic dielectric materials, inorganic dielectric materials or a combination thereof. The organic dielectric materials may be polyimide (PI), polycarbonate (PC), polyethylene terephthalate, polyethylene naphthalate ester, polypropylene (PP), polyethylene (PE), polystyrene (PS) or other suitable materials. The inorganic dielectric materials may be silicon oxide, silicon nitride, silicon oxynitride or other suitable materials.

The second metal layer M2 and the source electrode M2' of the TFT may be formed in a same process. That is, the second metal layer M2 may be made of a material of the source electrode M2' of the TFT. The material of the source electrode M2' may be referred to that exemplified or the gate electrode M1'.

The second dielectric layer 130 and the first protective layer 130 may be formed in a same process. The material of the first protective layer 130' may be referred to that exemplified for the gate dielectric layer 120'.

The second transparent capacitor electrode layer TR2 and the common transparent electrode (Vcom) TR2' may be formed in a same process. That is, the second transparent capacitor electrode layer TR2 is made of a material of the common transparent electrode TR2'. The common transparent electrode TR2' may be made of indium tin oxide (ITO), indium zinc oxide (IZO), hafnium oxide (HfOx), zinc oxide (ZnOx), aluminum zinc oxide (AZO), aluminum tin oxide (ATO), indium gallium zinc oxide (IGZO), gallium zinc oxide (GZO), indium titanium oxide (ITiO), indium molybdenum oxide (IMO), other transparent conductive materials or a combination thereof.

The pixel electrode TR1' is disposed in the sub-pixel area P and interposed between the gate dielectric layer 120' and the first protective layer 130'. The pixel electrode TR1' and the first transparent capacitor electrode layer TR1 may be formed in a same process. The material of the first transparent capacitor electrode layer TR1 may be referred to that exemplified for the common transparent electrode TR2'.

In another embodiment, the third transparent capacitor electrode layer TR3 shown in FIGS. 3, 4, 5 and 6B and another common transparent electrode (not shown) or a storage capacitor electrode (not shown) may be formed in a same process.

Figure 8:
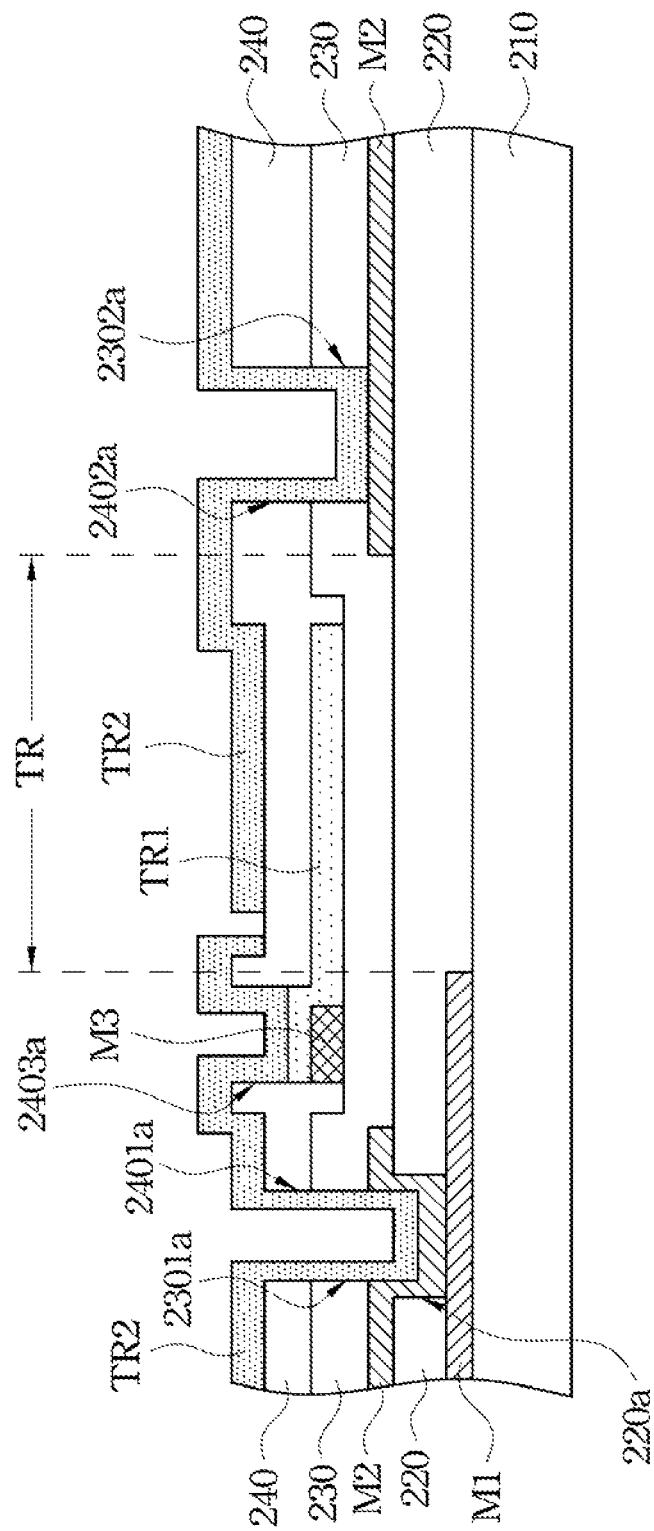
FIG. 8 is a cross-sectional view of capacitor structure according to Embodiment 6 of the present invention.

FIG. 8 is a cross-sectional view of a capacitor structure including two transparent capacitor electrode layers according to Embodiment 6 of the present invention. The capacitor structure includes a first metal layer M1, a second metal layer M2, a third metal layer M3, a first dielectric layer 220, a second dielectric layer 230, a third dielectric layer 240, a first transparent capacitor electrode layer TR1 and a second transparent capacitor electrode layer TR2.

The first metal layer M1 is disposed on the substrate 210. The first dielectric layer 220 covers the first metal layer M1 and includes a first opening 220a exposing a portion of the first metal layer M1.

The second metal layer M2 is disposed on the first dielectric layer 220, and a portion of the second metal layer M2 is contacted to the portion of the first metal layer M1 through the first opening 220a.

The second dielectric layer 230 covers the second metal layer M2 and includes a second opening 2301a and a third opening 2302a. The second opening 2301a is disposed right above the first opening 220a exposing the portion of the second metal layer M2. The third opening 2302a exposes another portion of the second metal layer M2.

The third metal layer M3 is disposed on the second dielectric layer 230. In one embodiment, the third metal layer M3 has an openwork pattern, which includes a frame-shaped pattern or a grid-like pattern.

The third dielectric layer 240 covers the third metal layer M3 and includes a fourth opening 2401a, a fifth opening 2402a and a sixth opening 2403a. The fourth opening 2401a is disposed right above the second opening 2301a. The fifth opening 2402a is disposed right above the third opening 2302a. The sixth opening 2403a is disposed right above the third metal layer M3.

The first transparent capacitor electrode layer TR1 is disposed on the second dielectric layer 230 and connected to the third metal layer M3.

The second transparent capacitor electrode layer TR2 is disposed on the third dielectric layer 240 and coupled to the second metal layer M2 through the fifth opening 2402a, in which the second transparent capacitor electrode layer TR2 and the first transparent capacitor electrode layer TR1 are arranged to be stacked in the thickness direction and mutually opposed across the third dielectric layer 240 therebetween. As such, the first transparent capacitor electrode layer TR1, the third dielectric layer 240 and the second transparent capacitor electrode layer TR2 constitute a capacitor. Further, the other portion of the second transparent capacitor electrode layer TR2 is coupled to the first metal layer M1 and the third metal layer M3 respectively through the fourth opening 2401a and the sixth opening 2403a.

As shown in FIG. 8, the first transparent capacitor electrode layer TR1 is coupled to the first metal layer M1 through the other portion of the second transparent capacitor electrode layer TR2 to receive a voltage from the first metal layer M1. The second transparent capacitor electrode layer TR2 is contacted to the second metal layer M2 through the fifth opening 2402a to receive a voltage from the second metal layer M2. The connecting relationship is not limited, as long as the first transparent capacitor electrode layer TR1 and the second transparent capacitor electrode layer TR2 are able to respectively receive the voltages from various layers.

Figure 9A:
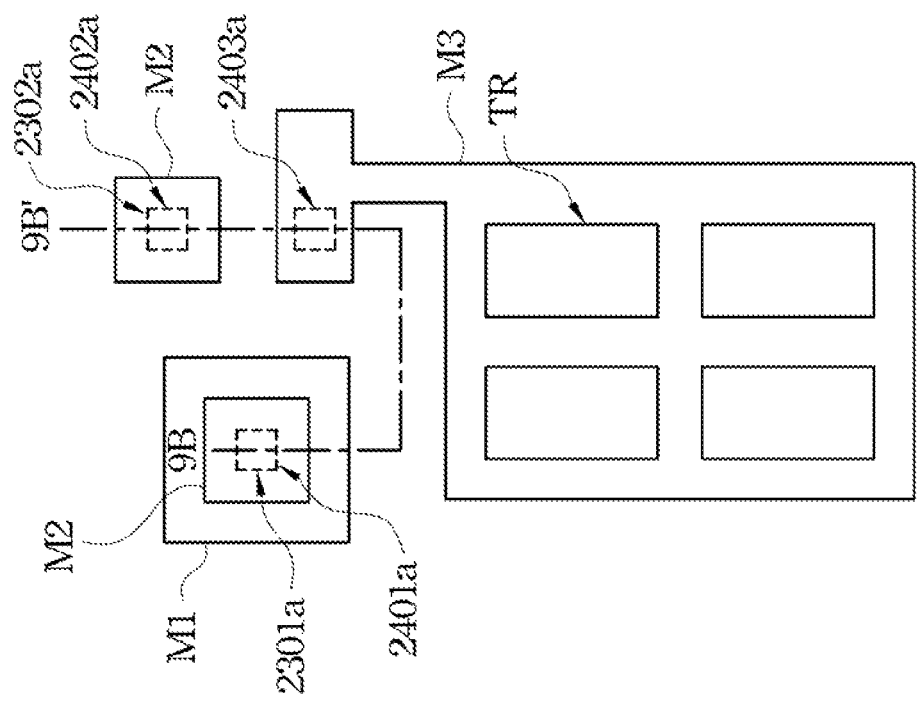
FIGS. 9A-9B are respectively a top view and a cross-sectional view of a capacitor structure according to Embodiment 7 of the present invention.
Figure 9B:
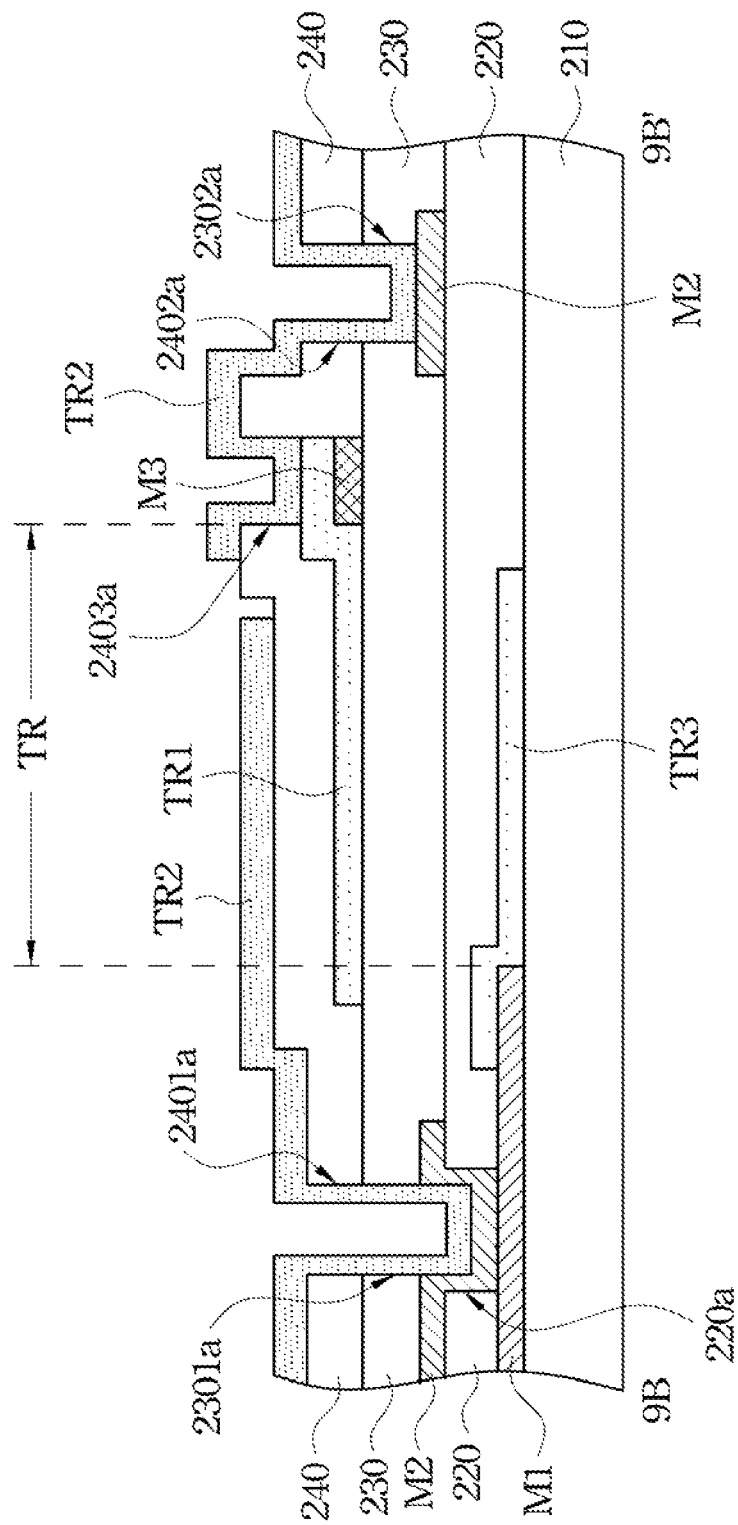

FIGS. 9A-9B are respectively a top view and a cross-sectional view of a capacitor structure according to Embodiment 7 of the present invention. In the embodiment, the third metal layer M3 may have an openwork pattern, as shown in FIG. 9A. The openwork pattern has at least one opening to let light pass through. That is, a window area of the openwork pattern can be regarded as a light-transmission area TR. The openwork pattern made of a metal can be used to reduce electrical resistance and maintain an enough light transmittance since a surface resistance of the metal is lower than that of the transparent capacitor electrode layer. Of course, in practical applications, the shape of the openwork pattern can be changed according to the need of the light transmittance, and not limited to the embodiment shown in FIG. 9A.

The difference between the capacitor structure of FIG. 9B and that of FIG. 8 is that the first transparent capacitor electrode layer TR1 of FIG. 9B is coupled to the second metal layer M2 through another portion of the second transparent capacitor electrode layer TR2 in the sixth opening 2403a and the fifth opening 2402a to receiving a voltage from the second metal layer M2. The second transparent capacitor electrode layer TR2 is coupled to the first metal layer M1 through the fourth opening 2401a to receive a voltage from the first metal layer M1. Also, the capacitor structure further includes a third transparent capacitor electrode layer TR3. The third transparent capacitor electrode layer TR3 and the first transparent capacitor electrode layer TR1 are arranged to be stacked in the thickness direction and mutually opposed across the first dielectric layer 220 and the second dielectric layer 230 therebetween, and the third transparent capacitor electrode layer TR3 is connected to the first metal layer M1. As such, the third transparent capacitor electrode layer TR3, the first dielectric layer 220, the second dielectric layer 230, the first transparent capacitor electrode layer TR1, the third dielectric layer 240 and the second transparent capacitor electrode layer TR2 constitute a capacitor.

Figure 10:
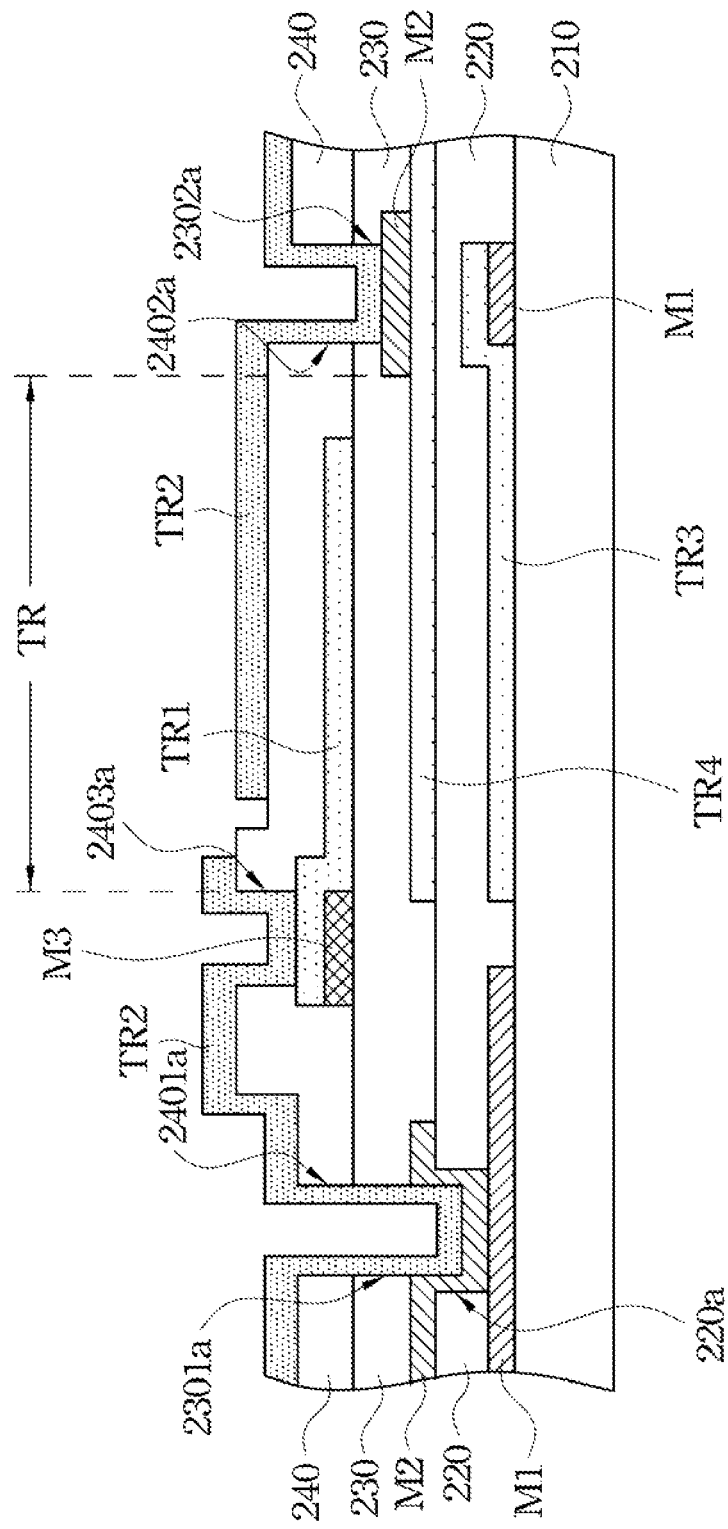
FIG. 10 is a cross-sectional view of a capacitor structure according to Embodiment 8 of the present invention.

FIG. 10 is a cross-sectional view of a capacitor structure including four transparent capacitor electrode layers according to Embodiment 8 of the present invention. The difference between the capacitor structure of FIG. 10 and that of FIG. 8 is that the capacitor structure of FIG. 10 further includes a third transparent capacitor electrode layer TR3 and a fourth transparent capacitor electrode layer TR4. The third transparent capacitor electrode layer TR3 and the first transparent capacitor electrode layer TR1 are arranged to be stacked in the thickness direction, and the third transparent capacitor electrode layer TR3 is connected to the first metal layer M1. The fourth transparent capacitor electrode layer TR4 and the second transparent capacitor electrode layer TR2 are arranged to be stacked in the thickness direction and mutually opposed across the second dielectric layer 230, the first transparent capacitor electrode layer TR1 and the third dielectric layer 240 therebetween, and the fourth transparent capacitor electrode layer TR4 is connected to the second metal layer M2. As such, the third transparent capacitor electrode layer TR3, the first dielectric layer 220, the fourth transparent capacitor electrode layer TR4, the second dielectric layer 230, the first transparent capacitor electrode layer TR1, the third dielectric layer 240 and the second transparent capacitor electrode layer TR2 constitute a capacitor.

In the embodiments, the third metal layer M3 is disposed on or under the first transparent capacitor electrode layer TR1. The first metal layer M1 is disposed on or under the third transparent capacitor electrode layer TR3. The second metal layer M2 is disposed on or under the fourth transparent capacitor electrode layer TR4.

Figure 11A:
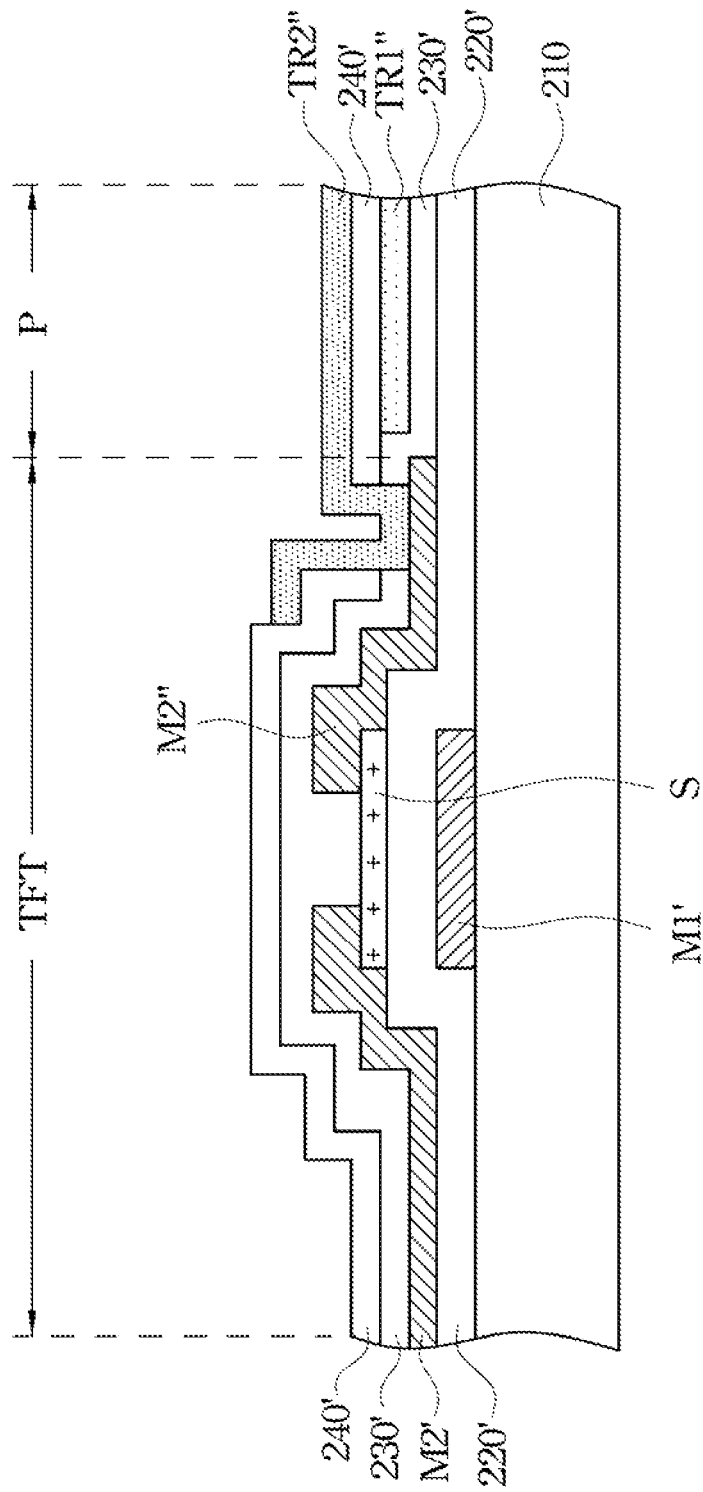
FIGS. 11A-11B are cross-sectional views of both a TFT region and a sub-pixel region of a driving substrate and a data line region thereof respectively according to one embodiment of the present invention.
Figure 11B:
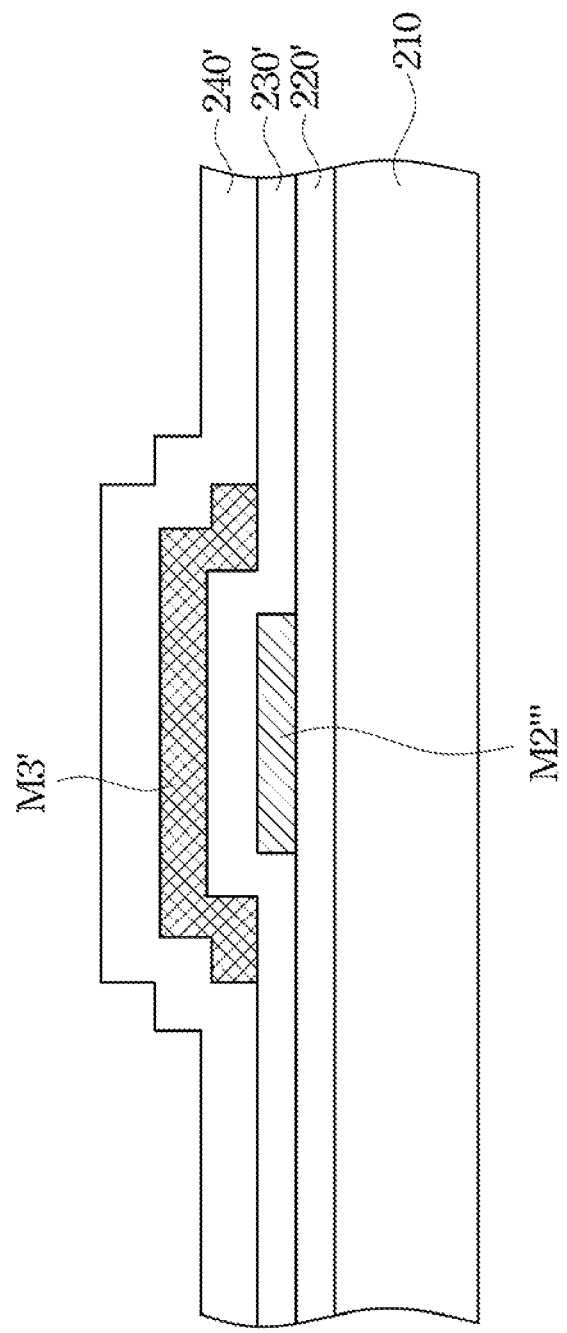

With a bottom gate type TFT and the capacitor structure of FIG. 8, the specific embodiments of each layer are described below. FIGS. 11A-11B are cross-sectional views of both a TFT region TFT and a sub-pixel region P of a driving substrate and a data line region thereof respectively according to one embodiment of the present invention. The TFT region TFT, the sub-pixel region P and the data line region may be disposed in the active area AA of FIG. 1. As shown in FIG. 11A, a TFT includes a gate electrode M1', a gate dielectric layer 220', a semiconductor layer S, a source electrode M2' and a drain electrode M2", a first protective layer 230', a common transparent electrode TR1", a second protective layer 240' and a pixel electrode TR2". As shown in FIG. 11B, a common line M3' is disposed on a data line M2''', and the first protective layer 230' is interposed between the common line M3' and the data lien M2'''. The common line M3' may be connected to the common transparent electrode TR1" of FIG. 11A.

Please refer to FIG. 8 and FIG. 11A, the specific embodiments of the elements of the first metal layer M1, the first dielectric layer 220, the second metal layer M2 and the second dielectric layer 230 shown in FIG. 8 and the elements of the gate electrode M1', the gate dielectric layer 220', the source electrode M2' and the first protective layer 230' shown in FIG. 11A may be referred to those exemplified for the corresponding elements (i.e., the element having the same name) of FIG. 2 and FIG. 7.

Specifically, the first transparent capacitor electrode layer TR1 and the common transparent electrode TR1" disposed in the sub-pixel area. P may be formed simultaneously. That is, the first transparent capacitor electrode layer TR1 is made of a material of the common transparent electrode TR1". The material of the common transparent electrode TR1" may be referred to that exemplified for the common transparent electrode TR2'. In addition, the second transparent capacitor electrode layer TR2 and the pixel electrode TR2" may be formed simultaneously.

Further, the third metal layer M3 and the common line M3' may be formed simultaneously, as shown in FIG. 8 and FIG. 11B. That is, the third metal layer M3 is made of a material of the common line M3'. The material of the common line M3' may be referred to that exemplified for the gate electrode M'1.

In addition, the third dielectric layer 240 and the second protective layer 240' may be formed simultaneously, as shown in FIG. 8 and FIGS. 11A-11B. The materials of the third dielectric layer 240 and the second protective layer 240' may be referred to that exemplified for the gate dielectric layer 120' of FIG. 7.

As mentioned above, the capacitor structure of GIP and the TFT array structure can be formed simultaneously, such that cost of the gate driving integrated circuits (ICs) can be saved. Also, the transparent capacitor electrode layers arranged to be stacked in the thickness direction may be regarded as a parallel capacitor, which can increase capacitance and reduce an occupying area of the overall scan driving circuit, such that it can meet the need for narrowing the border. Further, since the light-penetrable capacitor structure has enough light transmittance, which can meet the need for the photo-curable resin in the ODF process, it can be applied in the ODF process to save the process time and the cost.

It will be apparent to those ordinarily skilled in the art that various modifications and variations may be made to the structure of the present invention without departing from the scope or spirit of the invention. In view of the foregoing, it is intended that the present invention cover modifications and variations thereof provided they fall within the scope of the following claims.

What is claimed is:

1. A capacitor structure of gate driver in panel, comprising:
a first metal layer;
a first dielectric layer covering the first metal layer and including a first opening exposing a portion of the first metal layer;
a second metal layer disposed on the first dielectric layer, and a portion of the second metal layer is coupled to the first metal layer through the first opening;
a second dielectric layer covering the second metal layer and including a second opening disposed above the first opening exposing the portion of the second metal layer;
a first transparent capacitor electrode layer disposed on the first dielectric layer and connected to another portion of the second metal layer; and
a second transparent capacitor electrode layer disposed on the second dielectric layer and coupled to the first metal layer through the second opening, wherein the second transparent capacitor electrode layer and the first transparent capacitor electrode layer are arranged to be stacked in a thickness direction and mutually opposed across the second dielectric layer therebetween.

2. The capacitor structure of claim 1, wherein the second men layer is disposed on or under the first transparent capacitor electrode layer.

3. The capacitor structure of claim 1 wherein the first metal layer and the second metal layer have openwork patterns, and one of the openwork patterns includes a frame-shaped pattern or a grid-like pattern.

4. The capacitor structure of claim 1, wherein the panel comprises a thin film transistor (TFT), and the first metal layer and a gate electrode of the TFT are formed simultaneously, and the second metal layer and a source electrode of the IFT are formed simultaneously, and the second transparent capacitor electrode layer and a common transparent electrode of the TFT are formed simultaneously, and the first transparent capacitor electrode layer and a pixel electrode of the TFT are formed simultaneously.

* * * * *